United States Patent [19]

Heller et al.

[11] Patent Number: 4,567,653
[45] Date of Patent: Feb. 4, 1986

[54] METHOD AND APPARATUS FOR PROCESSING END-TAPED RADIAL COMPONENTS

[75] Inventors: Martin G. Heller, 68 Harvey Dr., Short Hills, N.J. 07078; Edward Pecha, Fair Lawn, N.J.; Philip Alcock, Morris Plains, N.J.; Douglas Smith, Pompton Lakes, N.J.

[73] Assignee: Martin G. Heller, Short Hills, N.J.

[21] Appl. No.: 605,371

[22] Filed: Apr. 27, 1984

[51] Int. Cl.[4] .................... H01R 43/00; B21F 1/00
[52] U.S. Cl. .................... 29/874; 140/105; 29/741; 29/882
[58] Field of Search .............. 29/741, 882, 564.6; 140/105

[56] References Cited

U.S. PATENT DOCUMENTS

| | | | |
|---|---|---|---|
| 4,054,988 | 10/1977 | Masuzima et al. | 29/564.6 |
| 4,077,439 | 3/1978 | Hamuro et al. | 140/105 X |
| 4,177,549 | 12/1979 | Mori et al. | 29/741 X |
| 4,263,708 | 4/1981 | Takahashi et al. | 29/564.6 X |
| 4,293,999 | 10/1981 | Woodman, Jr. | 29/741 X |
| 4,360,043 | 11/1982 | Maeda et al. | 140/105 |

OTHER PUBLICATIONS

Product Bulletin PT-1000 from Heller Industries, Inc., (Date Unknown).

Primary Examiner—Howard N. Goldberg
Assistant Examiner—Carl J. Arbes
Attorney, Agent, or Firm—Ralph R. Roberts

[57] ABSTRACT

This invention pertains to apparatus for processing end-taped electronic components. This apparatus provides means for high-speed trimming, bending, or combinations thereof, of the leads of these components. The dies as assembled portions are carried in blocks for easy removal from reciprocated slide members. Left- and right-hand die assemblies are carried in by blocks removably attached to slide members mounted in groove portions of a support block. This support block may be moved by screw threads on a shaft to provide desired fine adjustment of the trimming of the leads. Barrel-type eccentric cams are carried on this apparatus and are moved in timed relationship to each other and the motor drive. Each of these eccentric cams engages and reciprocably drives box-like follower members which move a slide member, and an associated die block and die assembly. The driven sprocket is positioned between and adjacent the reciprocated die assemblies at the processing station. Fixed guide means is provided to insure guiding of the tape and components at a high speed and positive alignment. The severed component is deposited into an accumulating bin.

35 Claims, 48 Drawing Figures

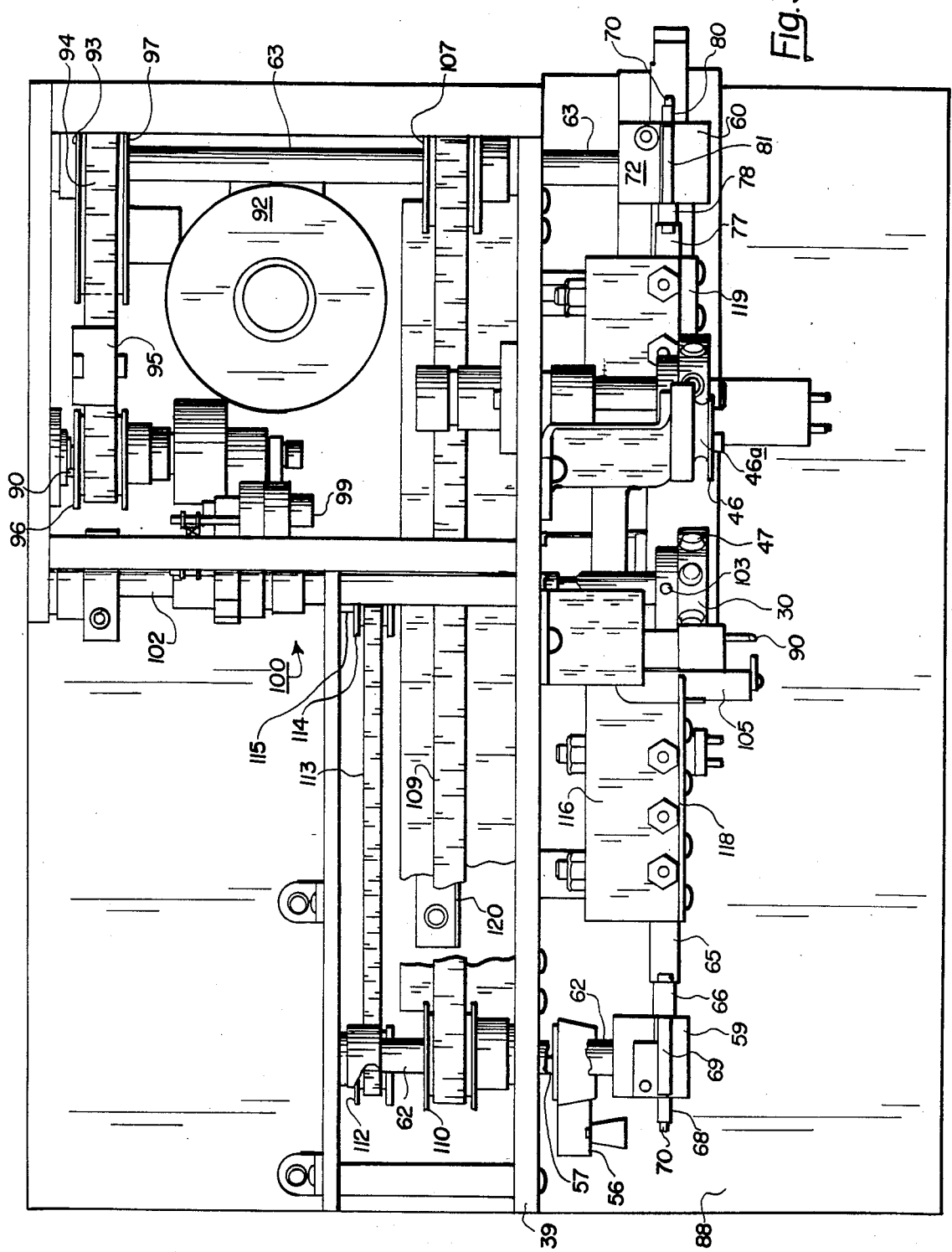

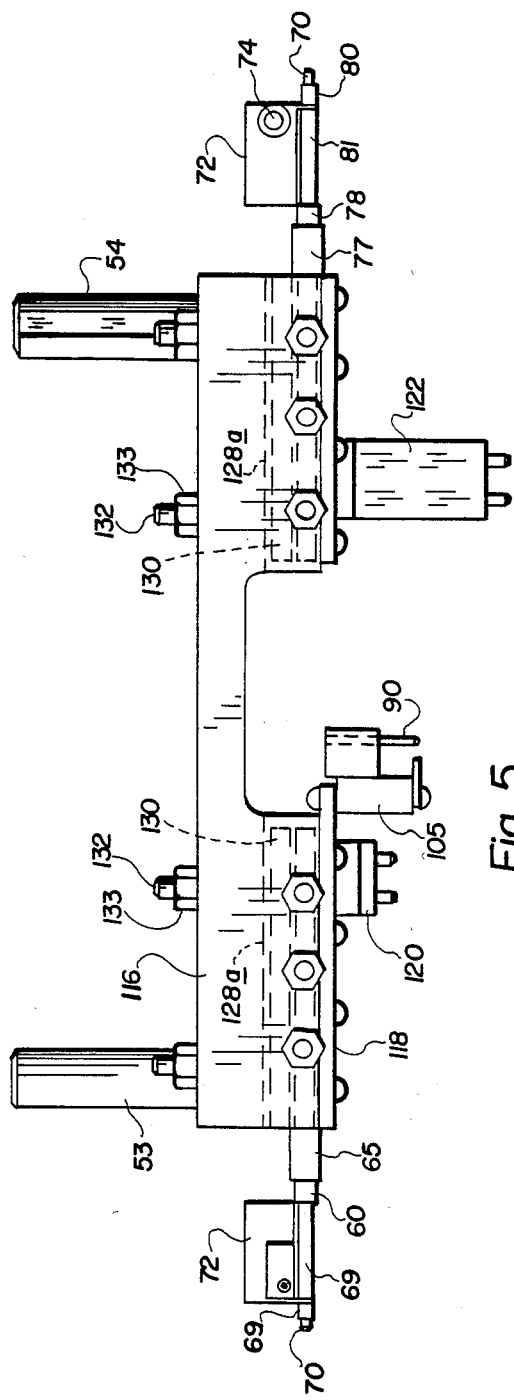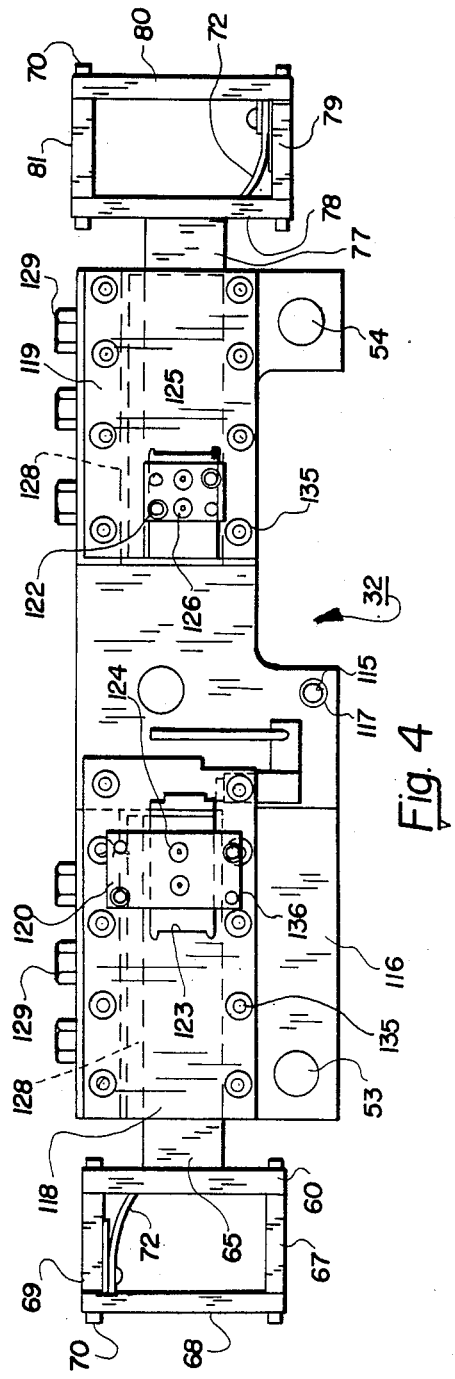

METHOD AND APPARATUS FOR PROCESSING END-TAPED RADIAL COMPONENTS

BACKGROUND OF THE INVENTION

1. Field of the Invention

With reference to the classification of art as established in and by the U.S. Patent and Trademark Office, this invention is believed to pertain to apparatus for processing I.C. components affixed to and carried in a precise array on punched tape. These components are trimmed and shaped by dies in this apparatus. This apparatus may be used for components whether with two or three leads.

2. Description of the Prior Art

The processing of taped I.C. components for P.C. board use is well known, but the known apparatus for processing is for a particular component. Changing of the apparatus for processing the leads of a different component is not easily acomplished. Usually the taped components have only two leads and in trimming little or no bending is contemplated. Precise forming of leads for insertion in holes formed in P.C. boards is not contemplated to be achieved with a single set of dies. Special apparatus and dies are known but an ability to make adjustments or changes with short shut-down times are not conventional.

Many U.S. patents have been directed toward the processing of taped components including specialized apparatus as shown in U.S. Pat. No. 4,398,658 as issued to SNYDER et al on Aug. 16, 1983. The use of reels for storing and withdrawing strips with like apertures is well known. This is particularly well known in photographic film and the like. Transporting sprockets, with and without power drive assists, are also well known. In the present apparatus it is contemplated that the taped electronic component is stored in reel form and is fed to a processing station whereat the component is shaped and/or trimmed and the tape is fed to a discarding chute and the now trimmed and shaped component is accumulated in the bin.

SUMMARY OF THE INVENTION

This invention may be summarized, at least in part, with reference to its objects.

It is an object of this invention to provide, and it does provide, apparatus for receiving I.C. components in a taped array and feeding said taped components to a processing station whereat they are trimmed and/or shaped and said processed components are discharged in a loose condition to an accumulating bin.

It is a further object to provide, and it does provide, apparatus for receiving taped components of two and three in-line leads and trimming and shaping said leads at high speeds such as twenty-five thousand components per hour. These electronic components may be U-form resistors, capacitors or transistors. The dies for the processing of taped components are easily changed and may provide only trimming or may include shaping and trimming. The dies are moved in and out by a lead screw to provide the exact positioning of the dies from the body of the electronic component.

In brief, this invention provides apparatus in which a reel support carries a rotatable reel of taped components over a deflector to a freely rotating sprocket and thence to a processing station. This processing station has removable dies which are reciprocated in timed relationship to the processing movement. The processed components are trimmed and/or shaped as desired and the now processed components are delivered one at a time to an accumulating bin.

This lead forming apparatus is particularly for end taped components either stored on a reel or as ammopack and may include components with two or three leads. Where components with three leads are processed, these leads are in-line. The apparatus provides an infinitely variable speed from a small rate to as much as twenty-five thousand components per hour. The processed components are fed to a positively rotated sprocket having projecting pins sized and adapted to engage the punched hole in the tape and in a very closely timed relationship actuate the dies to perform the desired trimming and/or shaping of the component. There is hereinafter more fully described a micrometer lead screw controlled actuation whereat the dies are adjusted to precisely adjust the length of the leads.

In the following detailed description, the preferred embodiment shows a rather small sized (desk top) lead-forming machine having a safety guard and an electrical interlock to prevent accidental and/or unwanted operation of the machine. An over-ride capability is provided that enables the operator to advance the tape, adjust the dies and/or empty the accumulation bin of the processed electronic components. The scrap tape material is conveyed easily from the machine. The dies providing the cutting and/or forming, during operation, are enclosed totally by the safety guard. This basic machine accepts die changes and tape delivery changes to accommodate different tapes and/or electronic components such as transistors, capacitors and U-form resistors.

In addition to the above summary, the following disclosure is detailed to insure adequacy and aid in understanding of the invention. This disclosure, however, is not intended to cover each new inventive concept no matter how it may later be disguised by variations in form or additions of further improvements. For this reason, there has been chosen a specific embodiment of lead-forming machine for end-taped radial components as adopted for use with taped components carried by a reel or in ammo-pack and showing a preferred means for feeding and processing the end-taped components. This specific embodiment has been chosen for the purposes of illustration and description, as shown in the accompanying drawings wherein:

BRIEF DESCRIPTION OF THE DRAWINGS

In the following description of the claims, various details are identified by specific means for convenience. These names are intended to be generic in their application. Corresponding reference characters refer to like members throughout the several figures of the drawings.

FIG. 3 represents a partly diagrammatic top view of the apparatus of FIG. 2, this view in the same scale as FIG. 2;

FIG. 4 represents a face view of the die apparatus assembly of FIGS. 2 and 3 and in the same scale, and showing in particular the removable and adjustably positioned die for trimming and shaping the leads of electronic components;

FIG. 5 represents a top or plan view of the die apparatus of FIG. 4;

FIG. 8A showing electronic components each with two leads, and FIG. 8B showing electronic components with three leads;

FIGS. 9A, 9B and 9C showing side, plan and end views of the cut-off knife before assembly.

FIGS. 10A, 10B, and 10C showing side, plan and end views of an inner clamp member; FIGS. 10D, 10E and 10F showing side, plan and end views of an upper punch member; FIGS. 10G, 10H and 10I showing side, plan and end views of a middle inner punch member, and FIGS. 10J, 10K, and 10L show side, plan and end views of a lower inner punch member;

The drawings accompanying, and forming part of, this specification disclose details of construction for the purpose of explanation, but structural details may be modified without departure from the concept and principles of the invention and the invention may be incorporated in other structural forms than shown.

DETAILED DESCRIPTION OF THE APPARATUS

EMBODIMENT OF FIG. 1A

Figure 1A:
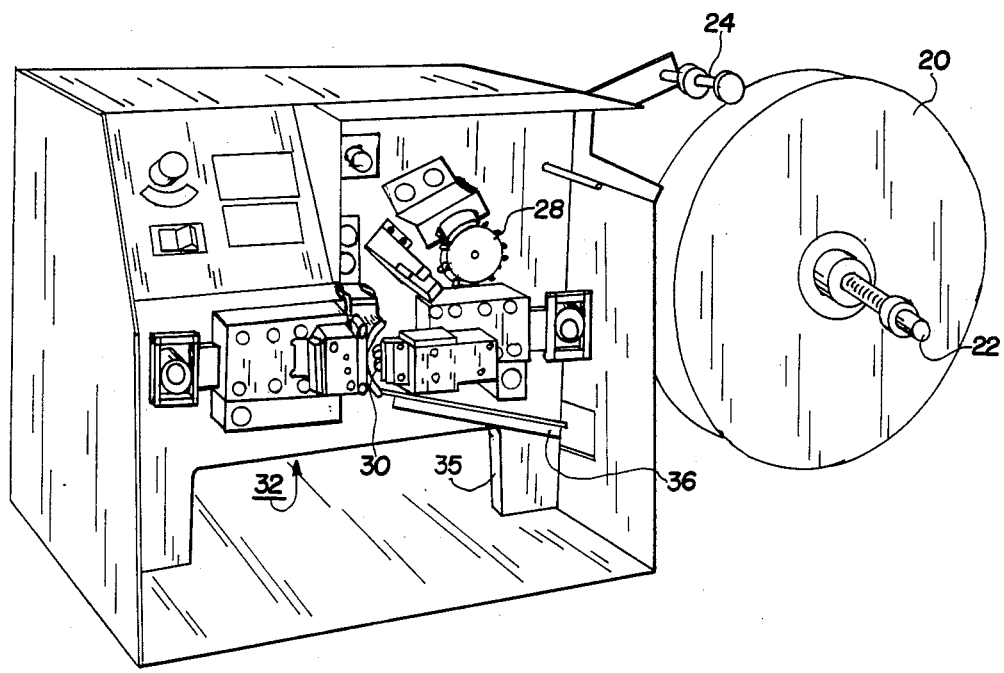
FIG. 1A represents a perspective view, partly diagrammatic, of the lead-forming and processing apparatus of this invention for end-taped electronic components and showing the general arrangement of the essential components.

Referring now and next to the drawings, the showing the FIG. 1A is a general perspective view of the lead-forming machine. In this view, the taped electronic components are shown as carried by and on a reel 20. These components are contemplated to be of like size, value and having the same processing requirement. The same apparatus may have reel support shaft 22 removed and a supply retainer attached for ammo-pack taped components (not shown). With a reel supply or ammo-pack, the taped components are fed over a deflector means 24 carried by the frame of the apparatus. This belt of taped components is identified as 26 with spaced apertures 27 (FIGS. 8A and 8B) therein and therethrough and proceeds from deflector 24 to a sprocket 28 which is freely rotatable. The taped components are fed downwardly and leftwardly to the processing station where drive sprocket 30 is rotated in a timed relationship to the actuation of the dies generally identified as 32 (FIGS. 6 and 7) and later to be described more fully.

Still referring to FIG. 1A, it is to be noted that as and after processing the now separated components 33 (FIG. 8A) are dropped into a bin 34 (FIG. 1B) for transport to assembly line use (not shown). The tape is carried by chute 36 to an accumulation means outside of the apparatus. This chute 36 extends to the right and downward from the sprocket 30 and is more clearly shown in FIG. 2 which is the face view of the apparatus.

EMBODIMENT OF FIG. 1B

Figure 1B:
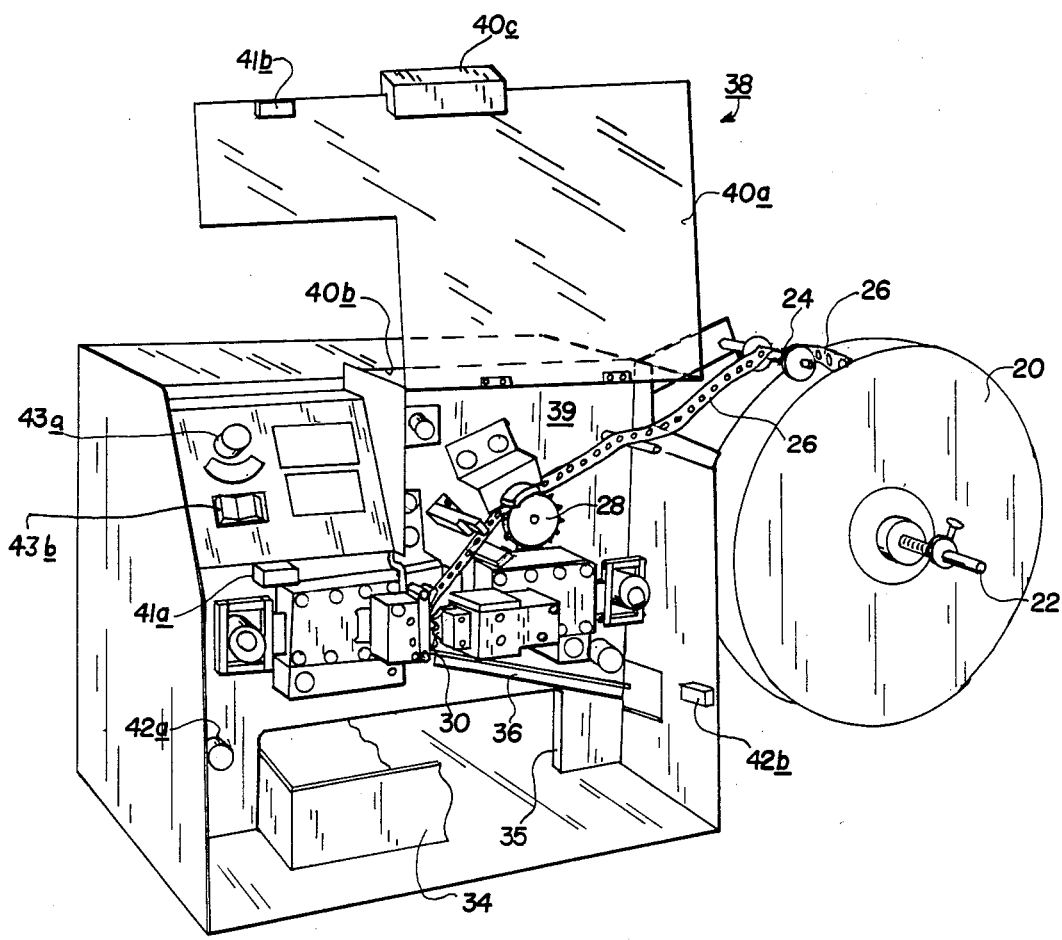
FIG. 1B represents the perspective view of the apparatus of FIG. 1A and showing in particular a plastic shield hingedly attached and indicating an interlock switch adapted to prevent accidental operation of the machine absent a protective positioning of said shield.
Figure 1C:
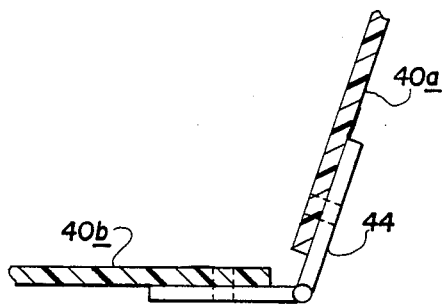
FIG. 1C represents a fragmentary sectional side view of a hinge as used with the protective cover shield of this apparatus.

In FIG. 1B, the view of FIG. 1A is repeated, in part, so as to illustrate a shield or guard 38 which is of plastic. A vertically disposed back plate or member 39 of metal carries this shield or guard. A front portion 40a of said guard is conventionally of clear plastic so that the operator of the machine can observe without disrupting the high-speed operations. This front portion is contoured to accommodate the machine controls and is hingedly attached at its upper end or edge to a fixed horizontal portion 40b, also of plastic, and usually lightly colored. Hinge means may be a butt or a piano-type hinge which is conventional and is depicted in FIG. 1C. The selection of the hinge means is merely a matter of preference. An interlock switch 41a is carried by this plate 39 and is actuated to a "run" condition when the shield is placed in the protective condition and is in its "down" position as established by a plurality of stops identified as 42a and 42b. This shield when swung into position provides means to exclude accidental exposure to hands, etc., of an attendant or observer from the actuation of the dies and transport movement of the taped components. An override control is provided when and while the shield 38 is moved to the "up" condition. A knob 43a, identified in FIG. 1B, is rotated for speed and direction control of a motor as identified and shown in FIG. 3 hereinafter. The desired override is provided by a toggle switch 43b which actuates the motor absent the signal from the interlock switch. The strip 26 is advanced by the operator who positions this strip while shield 38 is in the lifted condition and dies 32 and some of the drive mechanism are uncovered.

Still referring to FIG. 1B, it is to be noted that the interlock switch 41a (magnet responsive) is engaged by a magnet device 41b carried by and on the front portion 40a, and as the panel portion is swung into a "run" condition the switch circuit is closed. Stops 42a and 42b may be carried by bracket means and adjusted to establish the desired position of the portion 40a. A handle or grip member 40c is shown attached to the movable portion 40a and this provides a grasping means to prevent cutting of an attendant's hands. The bin 34 is shown only in part or broken away so as to depict an opening 35 in front panel. This bin may be removed for substitution by another empty bin since twenty-five thousand components per hour often require many bins.

EMBODIMENT OF FIG. 1C

In FIG. 1C is depicted in an enlarged scale a sectional and fragmentary view of the hinge support of the shield 38. The movable front portion 40a is retained by a hinge 44 to the fixed horizontal portion 40b. Since both the front and horizontal portions 40a and 40b are conventionally of plastic, there is a plurality of butt hinge members or, if desired, a piano-type hinge may be provided. The manner of securing and the type of hinge selection is a matter of preference.

EMBODIMENT OF FIGS. 2 AND 3

Figure 2:
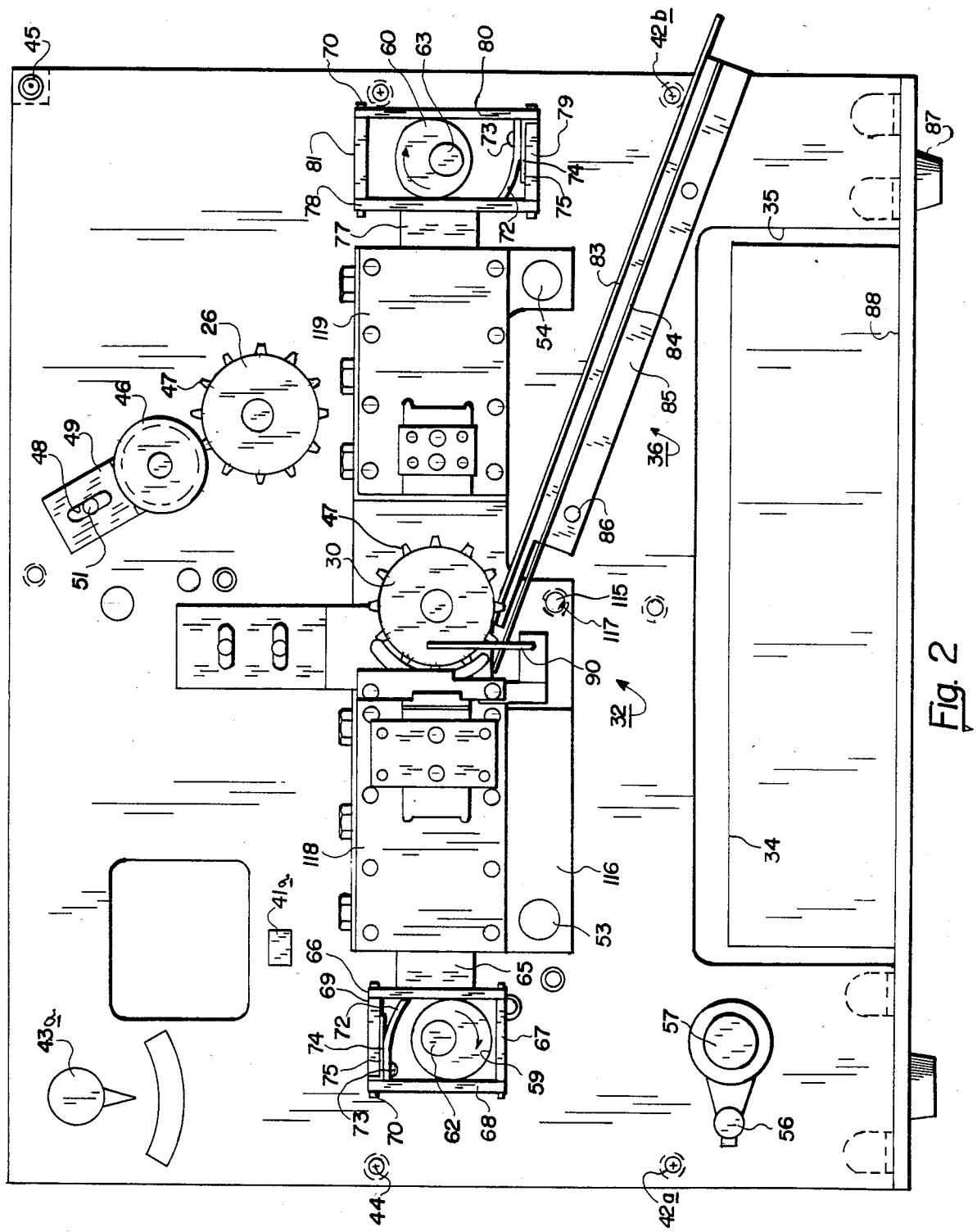
FIG. 2 represents a partly diagrammatic face or front view and in an enlarged scale of the processing apparatus of FIGS. 1A and 1B, this view showing the preferred general arrangement of the essential apparatus components.

In FIG. 2, the processing apparatus is shown in an enlarged and diagrammatic scale and is depicted as a face or front view. In the view of FIG. 2, the plastic shield 38 is removed. Support of the deflector 24 is provided by attaching and support means 45 at the upper right corner of this apparatus. The taped components 26 (FIG. 1A) are fed leftwardly and downwardly to freely rotating sprocket 28 which is shown mating with a rotatable disk 46 which is grooved (FIGS. 3 and 11B) to provide a receiving recess for the projecting pins 47 of the sprocket 28 and sprocket 30. A slot 48 is provided in support bracket 49 by which this idler guide sprocket 28 is mounted on vertical support plate 39.

From sprocket 28 the taped components 26 are advanced to powered driven sprocket 30 which moves in a positively timed relationship with the actuated dies generally identified as 32 in FIG. 1A. As each die assembly is designed to provide a specific result, such as trimming, bending and/or combinations thereof, the die assembly is carried on precision support rods or shaft portions 53 and 54. A crank arm 56 moves a connected shaft 57 for micrometer movement of the dies 32 as supported on precision rods or shaft portions 53 and 54.

It is to be noted in this view that time reciprocated movement of the die portions is provided by rotatable barrel cams 59 and 60 which are eccentrically mounted cylinders and, as seen in FIG. 3, are much longer than a box enclosure for each cam. Cam 59 is secured to and rotated as shaft 62 is rotated and in a like manner and in said timed relationship cam 60 is carried on and rotated by shaft 63. Die shank 65 has attached member portions 66, 67, 68 and 69, and cap screws 70 are used to assemble these member portions. A felt wiper pad 72 is carried between members 68 and 69 as the assembly of these members is made. Felt wiper pad 72 is saturated with oil or the like to provide lubrication to the surface of cam 59 as it is rotated. A rivet and spring metal holder 73 and 74 are used to maintain this pad within the box-like members and may be replaced when required.

Still referring to FIG. 2, it is to be noted that the die 32 has its right-hand portion moved by cam 60 with the rotation of shaft 62. Die shank 77 has attached member portions 78, 79, 80 and 81 which form a box enclosure. The cap screws 70, as in the enclosure of the left cam, are employed to secure the members together. A felt wiper pad 72, a rivet 73 and spring 74 are like those used for the left assembly, but it is to be noted that the pad 72 is on the lower side and that the spring metal retainer 74 is secured between members 79 and 80. It is also to be noted that cam 59 in the left box enclosure is an eccentric cam (FIGS. 12A and 12B) enclosed by member portions 66, 67, 68 and 69, and said cam is a sliding fit which engages member portions 66 and 68. The cam 60 is shown in detail in FIGS. 13A and 13B, and is formed with a dwell portion 60a and the member portions 78, 79, 80 and 81 provide an elongated box-like enclosure in which 78 and 80 are longer than corresponding member portions 66 and 68. This dwell 60a formed on cam 60 and box members 78 and 80 provides the timed reciprocation of the right die assembly.

After the processing of the taped components in and by the die 32, the now-processed components are dropped into the bin 34 which is freely movable in opening 35 and may be withdrawn from the processing apparatus and is accessible below shield 38 (not shown in FIG. 2). The discharge chute 36 includes upper and lower forwardly extending shelf portions 83 and 84 which are integral with or made a part of the back support member 85. Two mounting screws or the like 86 are utilized to secure this chute to the front support plate 39 of the apparatus. This discharge chute 36 provides the guide and pathway for the exiting of the tape after component processing. In this view is shown resilient support feet 87 attached to a bottom support plate 88. It is to be noted that an external finger 90 is provided to guide the processed parts from the die into the collection bin 34. A detailed description of the dies will be made in connection with later described FIGS.

FIG. 3 is a view of the machine looking downwardly and showing many of the components described and/or discussed above. Many of the components are seen as a diagrammatic representation to illustrate the relationship of the several components. Support plate 39 is attached to and is carried by bottom support plate 88 and, as seen, this plate 39 is slightly below the midpoint of the view. An electric motor 92 is conventionally a DC motor that is variable as to its speed and may be reversed with a slow speed to assist in threading taped components 26. The output of this motor causes timing belt pulley 93 to be rotated and in turn it engages and moves timing belt 94. This belt is brought to the desired tautness by an anti-friction tightener 95, of conventional construction. This belt 94 drives timing belt pulleys 96 and 97. Pulley 96 rotates shaft 99 and gear drive generally identified as 100. This gear drive may include idler gears, but this drive is adapted to rotate shaft 102 which carries on its lower end sprocket 30. A set screw 103 in a hub portion of this sprocket ensures that this sprocket 30 is precisely positioned and is rotated as the motor turns. To the left and lower than sprocket 30 is guide finger 90 identified above. A guard 105 may be one or more sheet metal pieces retained in a fixed position during operation. This guard insures stripping of the electronic components from the reciprocated die members during withdrawal. A cut-out or aperture in the guard allows the left die portions as they are moved rightwardly to extend beyond said guard.

Driven by the timing belt 94 is a timing belt pulley 97 which rotates shaft 63 which also carries a timing belt pulley 107. This pulley 107 carries and drives a timing belt 109 which rotates timing belt pulley 110 carried on and by shaft 62. The adjusting crank 56 rotates shaft 57 and timing belt pulley 112 carried by and on the inner end thereof. Rotation of this pulley 112 causes belt 113 to be moved and timing belt pulley 114 to be moved. A threaded shaft 115 is rotated to produce the micrometer adjustment of the dies. The threaded end of shaft 115 extends in and through a threaded portion 117 (FIG. 2) of carrier support 116 below die blocks 118 and 119 (seen in both FIGS. 2 and 3). A retainer angle 120 is provided so as to establish a rear stop for limiting the movement of the bin 34 into the apparatus. This retainer angle is shown in FIG. 3 and is attached to plate 88.

Spacers and angle support clips as well as intermediate plate portions are shown but are not identified as to a particular number.

USE AND OPERATION OF EMBODIMENT OF FIGS. 2 AND 3

The taped components 26 (as seen in FIG. 1B) are either carried by a reel 20 or, if desired, by an ammo-pack (not shown). Ammo-pack components are supply-folded in accordion style and stored in a rectangular container. The tape and components are directed up and over the deflector means 24 and thence to freely-rotating sprocket 28. This sprocket is made freely rotating as the formed apertures 27, although supposedly accurately spaced, are not sufficiently accurate for high-speed processing. This occurs through construction, application and/or drying of the adhesive. This taped component utilizes the formed aperture 27 when and as the taped component is brought to the processing dies 32. After the taped strip is processed, components with the now-trimmed and/or formed leads are dropped into the bin 34. The tape is now discharged in chute 36. It is to be noted that the taped strip 26 is fed to the driven sprocket 30 and with the knob control 43 the taped strip is placed on the pins 47, and when everything is in readiness the shield 38 is positioned in protective position. The lower or grasping edge of this shield has a handle grip 40c to allow easy manipulation by the operator of this apparatus.

EMBODIMENT OF FIGS. 4 AND 5

FIGS. 4 and 5 are shown in the same scale as FIGS. 2 and 3 and illustrate details of the processing station assembly generally identified as 32. The replaceable die components are reciprocably moved by left and right cams 59 and 60. This assembly is adjustably carried on the machine on fixed posts 53 and 54. The reciprocated dies provide trimming, shaping and/or bending to produce a desired conformation of the leads and separation of the electronic components from the tape. The punches, clamp members and knives are shown as representative and are detailed in other and later Figures. These die components, as illustrated, are not necessarily used in each die assembly. The preferred arrangement or positioning of the dies is depicted, but the die assemblies and the eccentric cam drives may be reversed and no patentable distinction is to be ascribed to this positioning except that the perforated tape be removed cleanly and the leads of the electronic components be removed cleanly and that said leads where and when desired be bent to the desired configuration.

In the processing station there are two die assemblies, each of which are reciprocably carried in a support block 116. Each or both assemblies may be removed and replaced by another assembly for processing a different type or sized electronic component. Sharpening, adjusting or replacing die components is accomplished easily. The severed components are discharged (dropped) at high speed into a bin 34 for later use, usually in a P. C. board assembly.

As seen in FIG. 4, the support block 116 is carried on and is slideable on precision shafts 53 and 54. The threaded end of shaft 115 (end is shown in FIG. 4 and in detail in FIG. 15) enters and is engaged by a threaded aperture 117 formed in said support block 116. Micrometer adjustment of the dies to the leads of the taped components is provided by rotating connected shaft 57 with crank arm 56 (FIGS. 2 and 3). This rotation of the threaded end of shaft 115 in the threaded aperture 117 causes the support block 116 to be moved in and out along the shaft portions 53 and 54.

A left die assembly, generally identified as 120, is reciprocated by and with slide member 65. This die assembly 120 is shown hereinafter in greater detail in FIG. 6. A right die assembly is generally identified as 122 and is reciprocated by and with slide member 77. This die assembly hereinafter is shown in greater detail in FIG. 7. In cover plate 118 is formed a cutout 123 which allows the attached die assembly 120 to be attached to member 65 by a plurality of screws 124. A cutout 125 is formed in plate 119 and screws 126 provide attaching means of and for die assembly 122 to slide member 77. Gibs 128 are shown in dashed outlined and are carried within grooved extents 128a formed in the support block 116. These gibs 128 are each adjusted to engage the respective top surfaces of slides 65 and 77. These gibs 128 are brought into the desired slide pressure by cap screws 129. A gib 130 is positioned against the side of each slide member 65 and 77 and in their adjacent contact provide slide looseness control. As seen in FIG. 5, studs 132 and nuts 133 are manipulated to provide the desired engagement of a side gib 130 against the side of a slide member. Screws 135 are depicted for attachment of cover plate 118 and plate 119 to the respective sides of block 116. Adjusting screws 136 are carried in the die assemblies to provide additional slide guide motion control of the dies against the cover plates. The cutouts 123 and 125 are provided so that the attachment of the die assemblies to the respective slide members is achieved easily by an attendant.

USE AND OPERATION OF EMBODIMENT OF FIGS. 4 AND 5

The die block 116 may be adjusted in or out with micrometer precision by the screw threads of shaft 115 in threads 117 in the block 116. If desired, the complete die block with the slides 65 and 77 and the appropriate box enclosures may be removed without change of the rest of the apparatus. If desired, the die assemblies 120 and/or 122 may be removed from the block 116. The removal of a die assembly is achieved easily and permits change, adjustment and/or repair as desired.

EMBODIMENT OF FIG. 6

Figure 6:
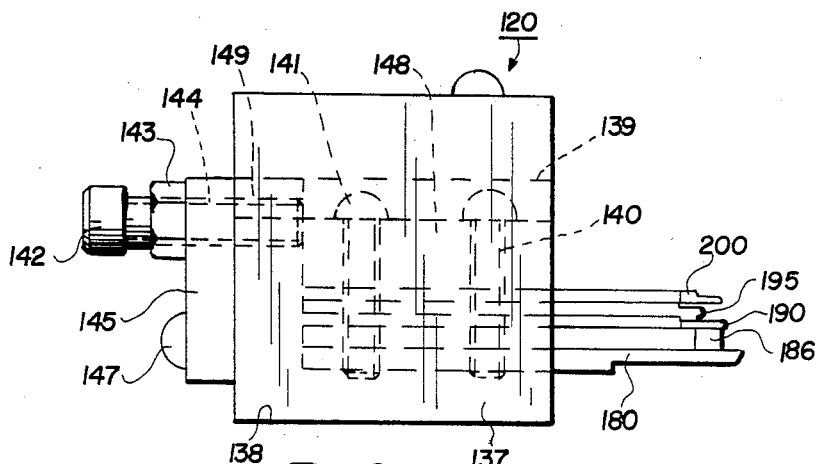
FIG. 6 represents a side view in an enlarged scale of the left die assembly, particularly for electronic components having three leads.

FIG. 6 depicts the left die assembly generally identified as 120. This assembly, as shown, is partly diagrammatic and as viewed is arranged for assembly of the die components in a mounted and secured condition. A retaining die block 137, as shown, has the retained die components which are merely illustrative of a known arrangement. These die components are described in detail with later Figures. Retaining die block 137 is mounted on surface 138 to associated slide member 65 (FIGS. 4 and 5) and is reciprocated therewith and thereby. Block 137 is formed with a T-shaped groove 139 formed in the side opposite surface 138. In the central portion of this groove is formed two clearance holes 140 which are sized for free passage and limited movement of the shank portions of cap screws 141 in a retainer plate 148.

Adjustment of the die components within limited extents is provided by two cap screws 142 and hex nuts 143 carried on the threaded shank portions thereof. The threaded ends of screws 142 are carried in threaded apertures 144 formed in stop block 145. This block is secured to the left side of die block 137 by two cap screws 147 whose threaded ends mount in threaded holes in the block 137. Retaining plate 148 is slidable in the T-groove 139 and clearance scallops or relief portions 149 are provided so that the inner ends of screws 142 may be rotated and moved inwardly and outwardly to establish a stop for retainer plate 148 and the secured die components.

ASSEMBLY AND OPERATION OF THE DIE ASSEMBLY OF FIG. 6

In FIG. 6, the retaining block 137 and the mounted die components are removed from the support block 116 by loosening screws 135, as noted in FIGS. 4 and 5 above. After loosening and removal, the block 137 is laid on an operation surface and screws 141 and plate 148 are then loosened and removed to change, rearrange, repair, replace or sharpen the die components carried by this block. This block and die components can be removed from the apparatus and another die and block installed to accommodate another electronic component. The removal, replacement or change of desired configuration of lead is easily achieved. Precise assembly and motion is contemplated. This left die assembly is reciprocated by the eccentric cam 59 (FIGS. 12A and 12B) which has no dwell.

EMBODIMENT OF FIG. 7

Figure 7:
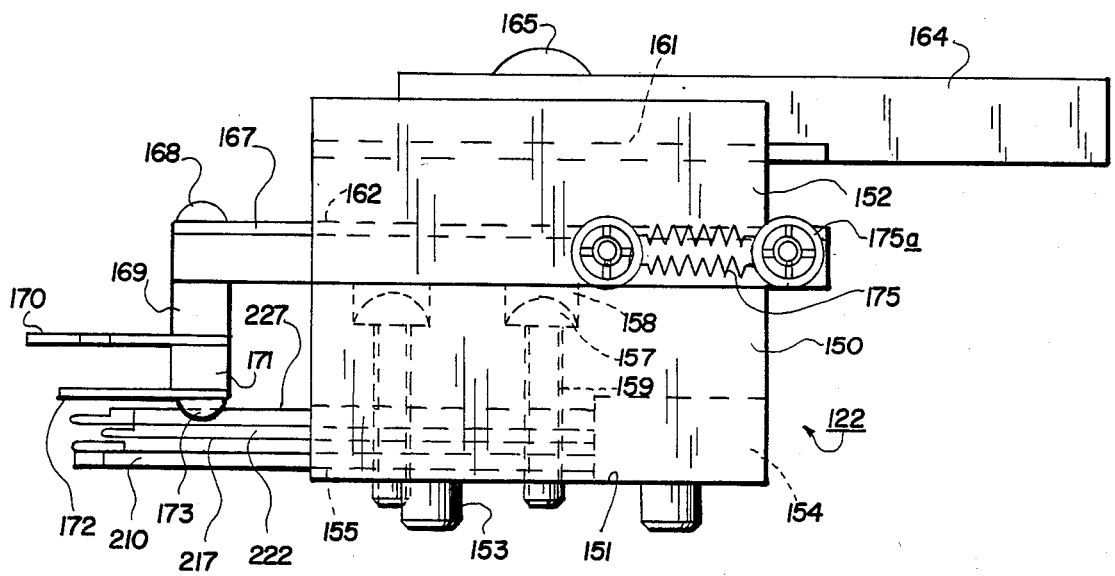
FIG. 7 represents a side view in an enlarged scale of the right die assembly, particularly for electronic components having three leads.

FIG. 7 depicts the right-hand die assembly, generally identified as 122 in FIGS. 4 and 5 above. This die assembly is reciprocated by and with slide member 77. As shown, this view is partly diagrammatic and particularly illustrates the assembly or disassembly of the several die components. Rather than a single retaining block member, as in FIG. 6, this retaining block is made in two portions. The bottom half, as viewed, is identified as 150 and bottom surface 151 is adjacent the slide member 77 and is secured thereto. This die assembly is reciprocated by cam 60 which has a dwell portion provided thereon, as shown in greater detail in FIGS. 13A and 13B. An upper block member or portion, identified as 152, is attached to the bottom half 150 by means of socket head cap screws 153. A stop member 154 is provided at the end of an open slot 155 in which are retained the several die components to be described later. Cap screws 157 have their heads retained in counterbores 158 and the shank portions thereof pass through clearance holes 159, and into threaded holes in a member of the die.

The upper block portion 152 is formed with upper and lower transverse dovetail grooves 161 and 162. In the upper dovetail groove 161 is mounted adjustably member 164 which is fixedly retained in said dovetail groove by cap screws 165 which secure member 164 by tightening the threaded portions in threads (not shown) formed in block 152. In the lower dovetail groove 162 is slideably carried T-shaped member 167. The left end of this member carries screws 168 which enter threads in spacers 169, finger 170, spacers 171 and finger 172 are retained by cap screws 173 which pass through finger 172, spacers 171 and finger 170 into the threads in spacers 169. A plurality of springs 175 is retained by clips 175a so at to urge member 167 and the fingers leftward. The fingers 170 and 172 assist in straightening the leads and retain the component body in position during trimming and bending.

ASSEMBLY AND OPERATION OF THE DIE ASSEMBLY OF FIG. 7

The right-hand die assembly 122 may be removed from the die block 116 by manipulating and removing screws 126. After removal, screws 153 are manipulated to cause the die blocks to be separated. The bottom half 150 contains the die components while the upper half 152 contains member 164 and spring-biased T-shaped slide 167. Finger 170 engages the outer body of the taped component to prevent movement while cut-off and bending of the leads occur. Finger 172 engages the leads during the bending. The die components, as in the case of the left die, may have the several die members repaired, replaced, or substitution may be made to accommodate particular configurations of the leads. As above, the assembly of dies may be laid aside while another die assembly is used for another electronic component. Adjustment of this die in relation to the slide member 77 is with member 164 in the T-shaped groove 162 and screws 165.

EMBODIMENTS OF FIGS. 8A, 8B, 8C and 8D

Figure 8A:
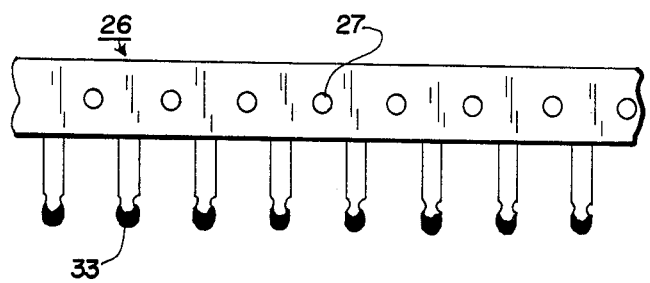
FIGS. 8A and 8B represent fragmentary plan views of taped electronic components.

In FIG. 8A there is depicted the tape 26 as carrying U-form resistors 33 in a sequential array. The tape is constructed conventionally of two strips glued together and with apertures 27 formed therein. These apertures are supposedly accurate in size and spacing, but with high-speed processing (twenty-five thousand components per hour) are not sufficiently accurate for apparatus that is provided by this invention. High speed requires precise control and prior devices have operated at lesser speeds so the accuracy of the holes can be tolerated. The die assemblies 120 and 122 (FIG. 4) are selected for the desired cut-off and the leads bent to provide a standoff, a snap-in standoff or other configuration. Also, an electronic component with two leads is processed as desired.

Figure 8B:
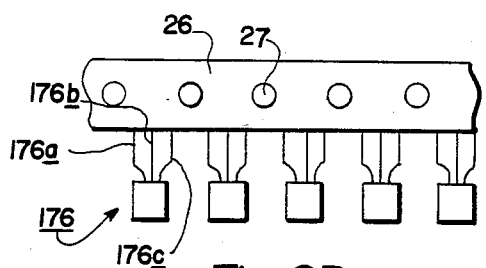

In FIG. 8B, tape 26 is shown with electronic components 176 in spaced array and having three leads 176a, b and c each. Conventionally, these components have a body 177 which has a flat 178 formed thereon. This flat provides electronic orientation of the leads which are bent to determined spread and/or standoff to suit placement in a P. C. board 179.

Figure 8C:
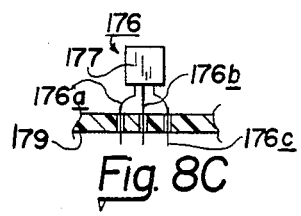
FIGS. 8C and 8D represent diagrammatic fragmentary views of three-lead electronic components where and when the leads are typically bent to provide an established mounting configuration in a P. C. board.
Figure 8D:
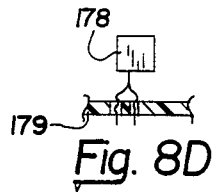

In FIGS. 8C and 8D, diagrammatic views show the electronic component 176 with leads 176a, b and c bent and spread for mounting in a selected attitude in a P. C. board 179. The P. C. board is formed with appropriately sized and spaced mounting holes. The die components of FIGS. 9A through 9O and 10A through 10L are representative of a die assembly. This showing has the component 176 with three leads as a diagrammatic face view in FIG. 8C, and this same component is shown in a side view in 8D and the leads are bent for a snap-in standoff.

DIE COMPONENTS OF LEFT-HAND DIE

Figure 9H:
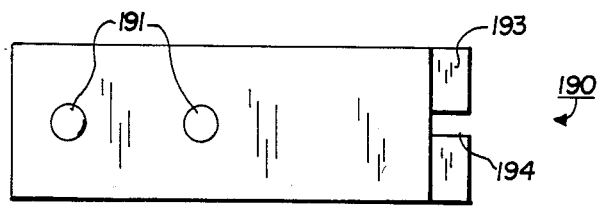
FIGS. 9G, 9H and 9I showing side, plan and end views of an upper outer punch member.
Figure 9I:
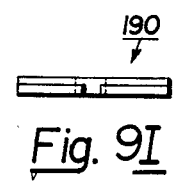
Figure 9G:
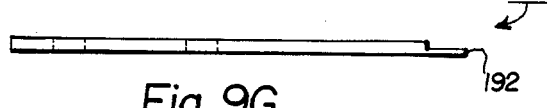

In the embodiment of FIG. 6 there are depicted five die components which are used for trimming and bending the leads of a taped component. In FIGS. 9A, 9B and 9C, a knife 180 is made of hardened tool steel (50 to 55 RC) which is about one-half inch wide, about seventy-thousandths of an inch in thickness, and about one and nine-sixteenths inches long. The end is ground at 181 to provide the cutting knife edge (about 15 degrees). Two threaded holes 182 and 183 are provided in this die portion and these are sized and spaced to accommodate the threaded ends of screws 141 shown in FIG. 6. There is a shallow relief portion 184 formed adjacent and extending from the cutting end 181. This knife is the outermost die portion in the assemblage used in the left die assembly of FIG. 6.

Figure 9E:
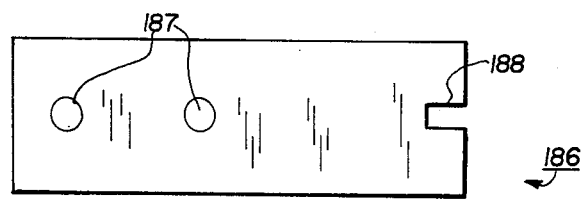
FIGS. 9D, 9E and 9F showing side, plan and end views of an outer clamp member.
Figure 9F:
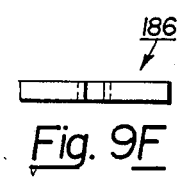
Figure 9D:
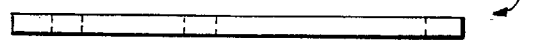
Figure 9B:
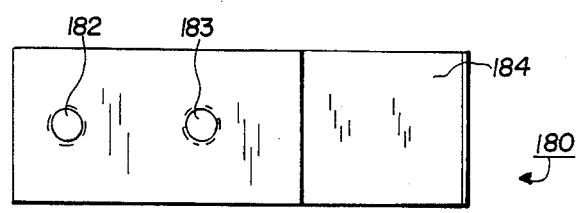
Figure 9C:
Figure 9A:
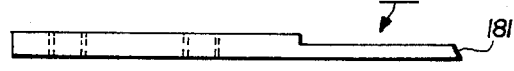
FIGS. 9A through 9O represent die components used in and with the die assembly of FIG. 6.

In FIGS. 9D, 9E and 9F is shown an outer clamp die member 186, also about seventy-thousandths of an inch in thickness. This clamp member is made from hardened steel (60 to 63 RC) and is of the same width as the knife 180. The length is just short of one and one-half inches. Two like clearance holes 187 are formed therein and therethrough for the passage of screws 141. These holes are sized and spaced to mate with the spacing in the knife 180. A rectangular notch 188, about ninety-thousandths of an inch in width and about one-tenth inches in depth, provides clearance for bending the lead of a component.

In FIGS. 9G, 9H and 9I is depicted an upper outer punch die member identified as 190. This member is of hardened steel (50 to 55 RC) and is the same width as the other die components. This component is about forty-six thousandths of an inch in thickness. Two like clearance holes 191 are formed in and therethrough for the passage of screws 141. The right end of this die component is rounded at 192 and there is provided a thinning of this end portion 193 of about seventeen hundredths of an inch. A rectangular notch 194, about nine hundredths of an inch wide, has a depth of about seventeen hundredths of an inch. As noted in the side view of FIG. 6, the rounded end 192 projects about one hundredth of an inch to the right from the end of clamp die 186.

Figure 9N:
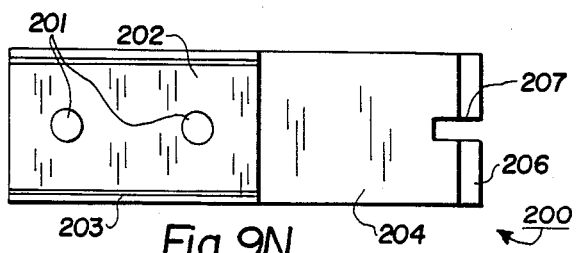
Figure 9O:
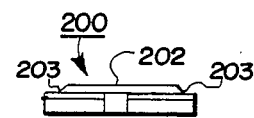
Figure 9M:
Figure 9K:
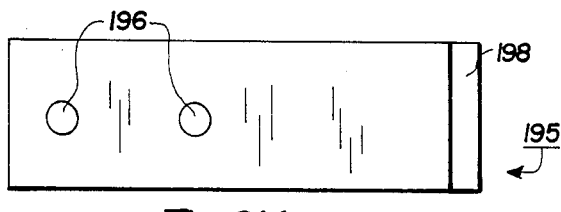
FIGS. 9J, 9K and 9L showing side, plan and end views of an outer middle punch member, and FIGS. 9M, 9N and 9O showing the lower outer punch member.
Figure 9L:
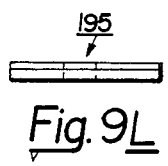
Figure 9J:
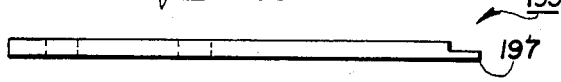

In FIGS. 9J, 9K and 9L, the die component is identified as 195 and is an outer middle punch. This member is also of hardened steel (50 to 55 RC) and about forty-eight thousandths of an inch in thickness. The same width is maintained and two like clearance holes 196 are provided for the passage therethrough of screws 141. The right end is rounded at 197 and a small thinning is provided at 198. This shelf is about eighteen thousandths of an inch thinner and about one hundredth of an inch in extent. It is to be noted that the rightward projection is about one hundredth of an inch shorter than die member 190.

In FIGS. 9M, 9N and 9O, the die component is identified as 200 and is a lower outer punch. This member, like the other die components, is of hardened steel (50 to 55 RC). The width is like the other components and is of three thicknesses. The greater thickness at the left is about sixty thousandths of an inch. In this area are formed two like clearance holes 201 which are sized and spaced to accommodate the shanks of screws 141. This thicker portion 202 is contoured to provide a small chamfer along the edges of about forty-five degrees and identified as 203. To the right of this thicker portion 202 is a flat surface 204 of about six-tenths of an inch and about fifty thousandths of an inch in thickness. To the extreme right is a small protruding lip portion 206 terminating with a rounded end 205. This lip is about one-tenth of an inch left to right and into this end is formed a rectangular notch 207 which is about nine hundredths of an inch in width and about twenty-two tenths of an inch long.

DIE COMPONENTS OF RIGHT-HAND DIE

Figure 10B:
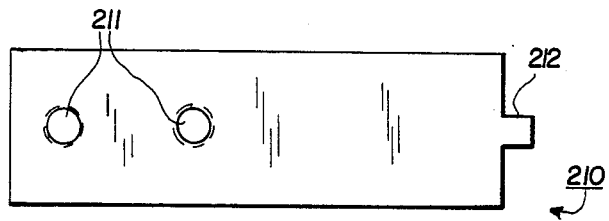
FIGS. 10A through 10L represent die components typically shown used in and with the die assembly of FIG. 7.
Figure 10C:
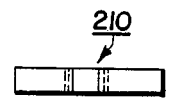
Figure 10A:
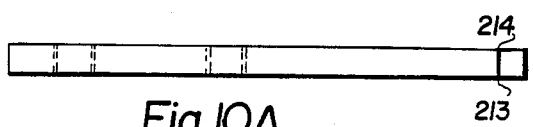

In the embodiment of FIG. 7, there are depicted four die components which are used for bending the leads of a taped component. In FIGS. 10A, 10B and 10C, an inner clamp, generally identified as 210, is of hardened tool steel (60 to 63 RC) which is about one-half inch wide and is about seventy-four thousandths of an inch in thickness. This die component is disposed to slide above knife 180 (FIG. 6) and mate with outer clamp 186 (FIG. 6) to clamp and retain the leads of an electronic component 176. This inner clamp member 210 has two threaded holes 211 which are spaced to accommodate and retain the threaded end of screws 157. A tongue portion 212 is about eighty-four thousandths of an inch in width and about one-tenth of an inch in extent. The bottom corner edge 213 is made sharp to cooperate with the knife 180 to sever the leads of the component from the tape. A radius is formed at 214 to assist in the bending of the leads without nicking the lead wires.

Figure 10K:
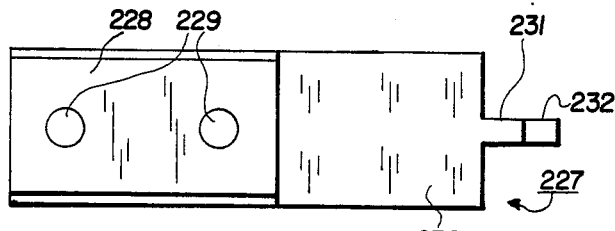
Figure 10L:
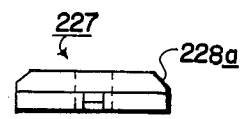
Figure 10J:
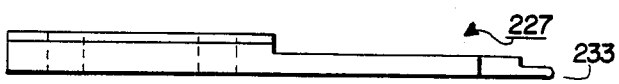
Figure 10E:
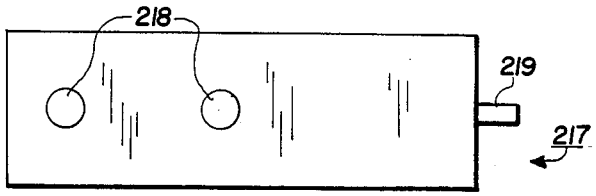
Figure 10F:
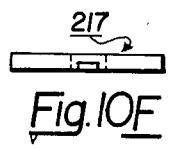
Figure 10D:
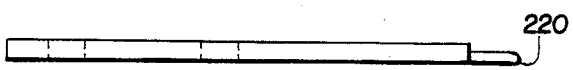

An upper inner punch, generally identified as 217, is shown in FIGS. 10D, 10E and 10F. This punch die member is made of hardened tool steel (50 to 55 RC) and also is about one-half inch wide and forty-six thousandths of an inch in thickness. Like clearance holes 218 are shown with appropriate spacing and size for the passing therethrough of screws 157. A protruding tongue portion 219 is about eighty-four thousandths of an inch in width and about seventeen tenths of an inch in extent. This tongue portion is thinned to about three hundredths of an inch in thickness, and the end 220 is fully rounded and polished to avoid nicking of a lead.

Figure 10H:
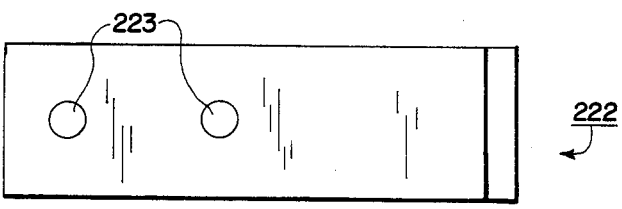
Figure 10I:
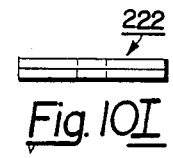
Figure 10G:
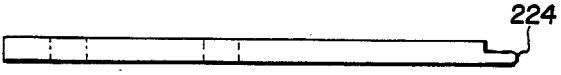

A middle inner punch, generally identified as 222, is shown in FIGS. 10G, 10H and 10I. This punch is also made of hardened tool steel (50 to 55 RC) and is about one-half inch in width and forty-eight thousandths of an inch in thickness. Two like clearance holes 223 are shown and have appropriate spacing and size for passing therethrough of securing screws 157 (FIG. 7). A protruding lip, about three hundredths of an inch in thickness and identified as 224, extends the full width of the die component and is about a tenth of an inch in extent and the edge 225 is fully rounded.

A lower inner punch, generally identified as 227, is shown in FIGS. 10J, 10K and 10L. This punch die component is made of hardened tool steel (50 to 55 RC), and, like member 200 in the left-hand die, is made with three thicknesses. The overall thickness is about a tenth of an inch and the width is about one-half inch. In the thickest portion 228 are formed two like clearance holes 229 which are sized and spaced to pass screws 157 (FIG. 7) therethrough. The portion 228 is beveled 229 along the edges of portion 228. A thinner middle portion 230 is about five hundredths of an inch in thickness. A tongue portion 231 has the thickness of portion 230 at its rear or attaching stem and a small rightward extending end portion 232 of about ten thousandths of an inch and is about three hundredths of an inch in thickness and has a full radius edge 233. The bevel 229 and 203 assist in mounting the die components into the retaining slots.

ASSEMBLY AND OPERATION OF THE DIE ASSEMBLY OF FIGS. 6 AND 7

It is to be noted that the die assembly of FIG. 6 (left hand) includes the cutoff knife 180 which is cycled in and out by the eccentric cam 59 rotatable with shaft 62. This die assembly is moved in time relationship with the die assembly of FIG. 7 (right hand) which is positioned so as to cooperate with the left-hand die assembly. The eccentric cam 60 carried on rotating shaft 63 is moved in precisely-timed relationship to the die assembly of FIG. 6. The lower inner clamp member 210 has the sharp knife edge 213 adapted to just slide by and above the cutting edge of knife member 180. The adjustment of these dies is from sliding contact to a maximum of two thousandths of an inch. The punch and clamp members of these die assemblies are made to bend the leads of the electrical components without nicking or otherwise affecting their capability. As noted above, the die assemblies can and may be substituted, repaired or otherwise altered to suit the desired and required conditions. Shut-down of the apparatus is minimal for change or repair.

EMBODIMENT OF FIGS. 11A AND 11B

Figure 11A:
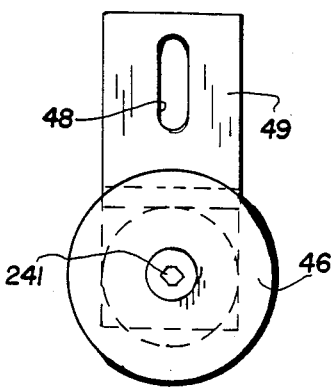
FIGS. 11A and 11B represent plan and side views of an idler grooved pulley that carries and guides the taped component to the driver pulley.
Figure 11B:
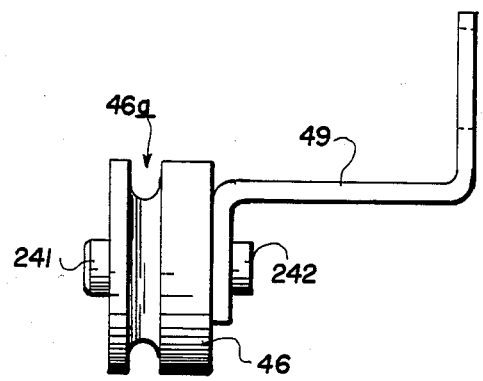

In FIGS. 11A and 11B, the idler pulley, generally identified as 46, is shown. This pulley has a groove 46a formed in its periphery to accommodate the tapered pins 47 on sprocket 28. Bracket 49, as shown, is a bent strip of metal in which a slot 48 is formed in one leg and in the other leg an aperture for a stud or bolt axle 241 and 242. This bracket is mounted by cap screw 51 (FIG. 2) to the plate 39. The use of this pulley and bracket has been discussed with regard to the apparatus of FIG. 2.

Figure 12A:
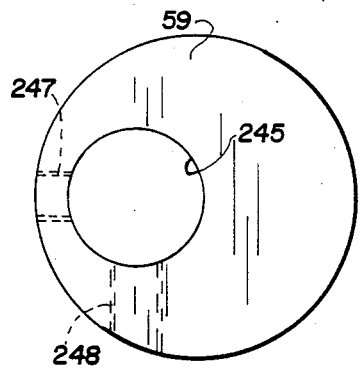
FIGS. 12A and 12B represent plan and side views of an eccentric cam that has no dwell and moves one half of the die assembly.
Figure 12B:
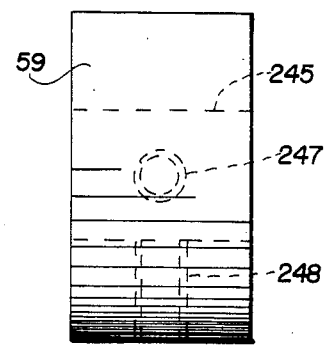

EMBODIMENT OF FIGS. 12A and 12B

Referring next to FIGS. 12A and 12B, the eccentric cam 59 for actuating the left die assemblies is shown. This cam is drilled off center to provide a bore or hole 245 which is a slide fit for shaft 62 (FIG. 2). Positive securing of this cam 59 to the shaft 62 is anticipated by set screws mounted and carried in threaded holes 247 and 248. This cam may be hardened to reduce wear. Block 115 may be adjusted toward and away from the apparatus without disturbing the mounting and use of this cam. The peripheral diameter of this cam 59 is designed to just slide between portions 66 and 68 (FIG. 2).

EMBODIMENT OF FIGS. 13A AND 13B

Figure 13A:
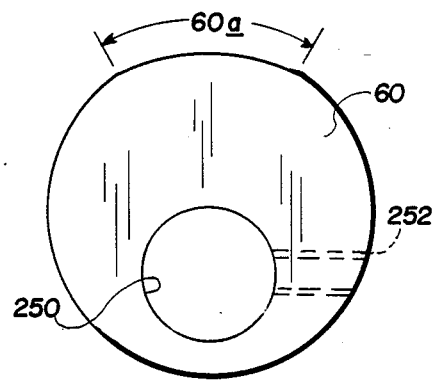
FIGS. 13A and 13B represent plan and side views of an eccentric cam that moves the die assembly, this cam having a dwell to provide a pause in the die actuation.
Figure 13B:
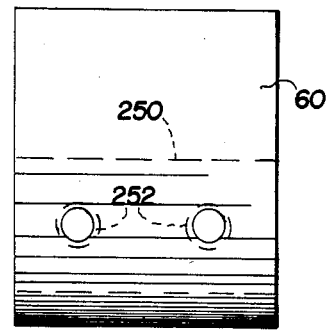

In FIGS. 13A and 13B, an eccentric cam, generally identified as 60, is formed with a dwell portion 60a. This dwell utilizes the axis of the cam to provide a dwell constant actuation for about forty-five to fifty-five degrees. The dwell length period is dependent upon the particular arrangement of dies. A bore 250 is formed in this cam 60 for mounting of this cam on a rotated shaft 63, as seen in FIG. 2. Two like set screw holes 252 are threaded and provide means for tightening set screws to secure this cam in a determined position on this shaft. The shafts 62 and 63 are contemplated to have flats formed thereon, and the set screws in cams 59 and 60 are utilized to insure the predetermined positioning of these cams on the timed rotation of the shafts.

EMBODIMENT OF FIG. 14

Figure 14:
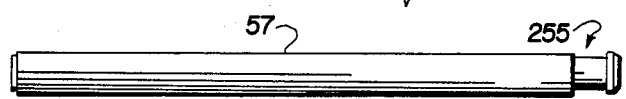
FIG. 14 represents a side view showing a shaft as used for the speed control knob.

In FIG. 14 is a plan view of shaft 57 which is actuated by crank 56 (FIG. 2). This crank is removably mounted on the right or projecting end of the depicted shaft. A groove 255 is provided for the engagement by a set screw conventionally provided in the crank arm 56.

EMBODIMENT OF FIG. 15

Figure 15:
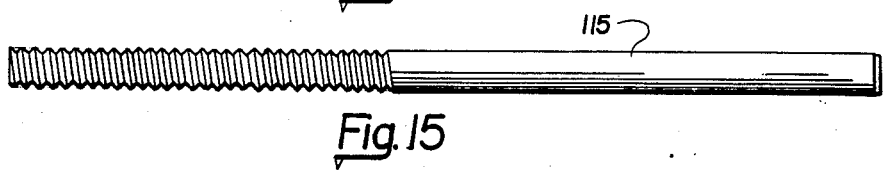
FIG. 15 represents a side view of a shaft and threaded-end portion of said shaft used to adjust the die carrier into a desired position.

Referring next and finally to the showing in FIG. 15, the adjusting shaft 115 is shown with threads formed on the left end. These threads mate with female threads 117 provided in the die block 116 (FIG. 4) and move the die block in and out to provide the desired adjustment.

The apparatus described above in detail also provide method steps for processing the electronic components that are end-taped. These steps include:

(a) providing a support frame and enclosed drive means having forward, stationary and reverse actuation provisions, this drive means having selectable speeds;

(b) supporting, retaining and delivering end-taped components to a processing station carried by said support frame;

(c) trimming and severing the leads of end-taped components from said end-tape, the trimmed leads having the desired precise length, and providing at this processing station reciprocable and cooperating dies that cleanly sever and trim the leads in conjunction with rotating a driven sprocket characterized as having a multiplicity of radially disposed tapered pins, said pins sized and positioned to precisely enter formed apertures in the tape and position said tape and components in said processing station;

(d) carrying a support block on said support frame so that this support block may be infinitely moved in and out of the plane of the tapered pins of the driven sprocket;

(e) reciprocating opposed die assemblies, each carried in die blocks; and securing each die block to a reciprocated slide member carried in and slideable in groove means provided in said support block;

(f) rotatably driving a pair of eccentric cams, each of which is carried on a shaft moved in a precise and timed relationship to each other and the drive means, each cam driving a boxlike enclosure connected to and moving the reciprocable slide member;

(g) releasably securing left-and right-hand die assemblies to slide members carried in said groove means;

(h) fixedly positioning guide means so as to engage and guide body portions of the end-taped components before processing and insuring that each component is brought into positive positioning on the tapered pins of the drive sprocket during processing, and (i) providing movable guide means so as to be resiliently actuated by and with one of the die assemblies, said movable guide means adapted to engage the component body during die operations and reciprocated by and with a die block.

It is to be noted that the end-taped components are drawn at a determined high-speed rate by a rotated tapered-pin sprocket which is rotated in a timed actuation to processing dies. This tape and secured components are drawn from a supply reel or ammopack over a deflector and then, with a determined tracking path to and through a free-turning sprocket, to the driven sprocket. A hinged guard is provided to protect the operator during high-speed processing. The dies are carried in block members which are easily removable from slide members carried in the support block. The box-like cam follower construction allows micrometer adjustment of the dies by moving the support block by screw means. The processed component is dropped into a supply bin for accumulation and subsequent use in a P. C. board.

Terms such as "left," "right," "up," "down," "bottom," "top," "front," "back," "in," "out" and the like are applicable to the embodiment shown and described in conjunction with the drawings. These terms are merely for the purposes of description and do not necessarily apply to the position in which the lead-forming apparatus for end-taped radial components may be constructed or used.

While a particular embodiment of the apparatus has been shown and described, it is to be understood that the invention is not limited thereto and protection is sought to the broadest extent the prior art allows.

What is claimed is:

1. Apparatus for trimming and, where and when desired, forming the leads of end-taped radial electronic components, after which the trimmed components are discharged to and into accumulating means, said apparatus including:
   (a) a support frame and an enclosed drive means attached to said support frame, said drive means having forward, stationary and reverse actuation provisions and with selectable speeds;
   (b) means for supporting, retaining and delivering end-taped components from a supply to a processing station which is attached at a mid-portion of and at a forward portion of said frame for said apparatus;
   (c) means provided at said processing station and said apparatus for the trimming and severing the leads of end-taped components from said tape, said trimming and severing means including reciprocable dies moved by said enclosed drive means, said dies carried and retained by guides secured to said support frame, these dies adapted to cleanly sever the leads of the end-taped radial electronic components, said tape advanced in a precise relationship with said reciprocable dies with a precisely-rotated drive sprocket having a multiplicity of precisely-spaced, radially-disposed, tapered pins, these pins sized and spaced so at to enter formed apertures in the tape, this sprocket positioned between the reciprocable dies so that said tape and attached components are precisely advanced as the sprocket is rotated to position said tape and attached components in said processing station;
   (d) a support block positioned at said processing station and slideable on posts carried by said support frame and means operatively associated with said support block for infinitely adjusting said support block to a desired position, said support block also having a retaining groove formed therein;
   (e) means for removably securing each of a pair of opposed die assemblies arranged as left- and right-hand assemblies to said support block, each of said die assemblies also releasably secured to a reciprocable slide member carried in the retaining groove formed in the support block, the die assemblies selectively movable in and out in relation to a plane through the tapered pins on the driven sprocket;
   (f) a pair of driven eccentric barrel cams, each cam carried and rotated by a shaft in bearings mounted in said frame, each of said shafts moved in a precisely-timed relationship to each other and by the drive means, each eccentric cam reciprocably driving a box-like enclosure attached to a reciprocable slide adapted to removably carry a die assembly;
   (g) guide means carried by the frame and apparatus and disposed between the delivery means and processing station so as to engage and guide the end-taped components and tape to bring the tape and components into positive positioning and placement on the tapered pins of the driven sprocket as said sprocket is rotated, and
   (h) movable guide means resiliently actuated and moved with one of the die assemblies, this movable guide means adapted to engage and straighten a body of a component when misaligned, said movable guide means carried by a reciprocated die block.

2. Apparatus for processing end-taped components, as in claim 1, in which the guide means for the tape includes a deflector carried by said support frame and at the upper portion thereof this deflector adapted for initially receiving the tape and attached components before delivery to the guide means, and shortly thereafter there is provided a free-turning sprocket carried on a face portion member of the apparatus, said sprocket having a plurality of tapered pins and in association therewith and adjacent thereto and disposed in the same plane is a freely-turning grooved roller or disc which engages the advanced tape and urges said tape and radial components into aligning engagement of the free-turning sprocket after which this guided tape and components are delivered to the processing station.

3. Apparatus for processing end-taped components, as in claim 2, in which the movable guide means includes an apertured guide in association with the precisely rotated driven sprocket and tapered pins, said movable guide means carried by the support block and selectively positioned to direct the tape and apertures therein to position said tape and the end components in the processing station on the driven sprocket while the left- and right-hand reciprocated die assemblies trim and shape the lead portions exterior of the tape.

4. Apparatus for processing end-taped components, as in claim 1, in which there is provided a guide chute carried by and on the front face of the apparatus and adapted to receive and transport the tape after the components have been severed therefrom to an accumulation position exterior of the apparatus, said guide chute adjacent and below the processing station and disposed with a downwardly-directed slope from said processing station to said exterior.

5. Apparatus for processing end-taped components, as in claim 1, in which the eccentric barrel cams include a constantly eccentric cam as a first cam carried by rotated shaft mounted in said frame and adapted to reciprocably move a first opposed die assembly and one eccentric barrel cam having a dwell portion providing the second cam and carried by another rotated shaft mounted in said frame and adapted to reciprocably move the other and second of the opposed die assembly, said die assemblies providing bending and/or spreading of the leads, said eccentric barrel cams being located outward of the opposed die assemblies.

6. Apparatus for processing end-taped components, as in claim 2, in which each eccentric cam as it is revolved reciprocably moves a box-like enclosure which includes four removably replaceable member portions forming a rectangle in which two first portions are substantially parallel to the reciprocated motion of the die assemblies and two of the other member portions as second portions are opposed and disposed to be substantially normal to the first portions, these second portions so spaced as to slideably engage and retain an eccentric barrel cam, these four portions secured by screws or bolts and with each barrel cam lubricated by a felt or felt-like wiper treated with lubricant disposed to apply a thin film of lubricant on the cam periphery as the cam is rotated, said wiper being removably carried and attached to each of said box-like enclosures.

7. Apparatus for processing end-taped components, as in claim 5, in which the die block moved by the barrel cam having the dwell also has a spring-biased finger which provides the movable guide which is disposed to be moved with the reciprocated die block, said finger adapted to align the component body in an attitude and position when said body is in a position other than that desired and anticipated.

8. Apparatus for processing end-taped components, as in claim 7, in which the die block moved by the dwell cam is of two halves; in a first half is mounted and retained the die components, and in the second half is mounted the spring-biased finger.

9. Apparatus for processing end-taped components, as in claim 8, in which the second half has at least one T-slot formed therein and the spring-biased finger is carried by a T-bar slideable in said T-slot, this T-bar urged into guiding position by at least one spring having a first end attached by a clip carried by the T-bar, and the other end of said spring attached to another clip secured to the die block.

10. Apparatus for processing end-taped components, as in claim 1, in which after processing the severed component is dropped into a bin.

11. Apparatus for processing end-taped components, as in claim 6 in which a cutting knife member of the die components carried by the die block is moved by said eccentric cam having no dwell, and there is provided a mating die component having a mating sharp edge which is carried by that die block moved by that eccentric cam having said dwell portion.

12. Apparatus for processing end-taped components, as in claim 1, in which the drive means includes at least two timing belt pulleys, each of said timing belt pulleys carried on a shaft rotatably mounted in said support frame and driven by at least one timing belt and providing a positively-timed and controlled movement of said shafts, each of which said shafts carry an eccentric cam, with said shafts driven by a D.C. motor.

13. Apparatus for processing end-taped components, as in claim 12, in which there is provided an infinite adjusting of the support block on support posts on which the support block is carried, these posts disposed in parallel array and approximately midway of the support posts there is an adjusting shaft having a screw-threaded end, said shaft rotatably carried by a bearing mounted in the support frame and with said threaded end of the shaft engaged and mounted in compatibly-formed threads in a hole formed in the support block.

14. Apparatus for processing end-taped components, as in claim 13, in which the adjusting shaft, having a screw-threaded end, also has a secured timing belt pulley mounted on said adjusting shaft, this timing belt pulley driven by a timing belt and by another timing belt pulley secured to and carried on a crank shaft adjustably mounted and carried by said support frame and with a crank attached to said shaft so that this crank is readily manipulable while the apparatus is actuated.

15. Apparatus for processing end-taped components, as in claim 1, in which there is provided a guard of the reciprocated die portions, this guard hinged at its top edge to a top portion of a housing of and for the apparatus, this housing secured to and attached to said support frame, this guard with its hinge attachment adapted to be swung to a non-interfering position so as to permit repair, replacement, sharpening and/or exchange of die assemblies, and for feeding the tape to the processing station.

16. Apparatus for processing end-taped components, as in claim 15, in which there is provided an interlock switch carried by the frame and a switch actuator carried by the hinged guard.

17. Apparatus for processing end-taped components, as in claim 16, in which the switch actuator is a magnet and there is a handle grip on the hinged guard to assist in manipulation of the guard.

18. Apparatus for processing end-taped components, as in claim 17, in which the drive means is a D.C. motor having a selective speed and direction, and there is provided in the circuit an override capability of the interlock switch so as to permit threading of the tape while the hinged guard is in lifted condition.

19. Apparatus for processing end-taped components, as in claim 1, in which the die assembly utilizes a plurality of screws to secure several stacked members in a groove in a die block, and in one of said die blocks there is provided a stop means providing alignment and positioning of the stacked die members.

20. Apparatus for processing end-taped components, as in claim 19, in which the die block carrying the cutoff knife includes an adjustable stop provided in a stop block removably secured to the die block and screw means carried in said stop block for adjusting the stop.

21. Apparatus for processing end-taped components, as in claim 20, in which each slide member carried in said grooves in the support block is enclosed by a removable cover secured to said support block, and with each groove carrying a slide member sufficiently oversize so that gibs may be carried in the groove and engage the longitudinal surfaces of the slide member and be adjusted to support the slide member in the desired plane and with the desired and required sliding clearance.

22. Apparatus for processing end-taped components, as in claim 21, in which each cover plate has a cut-out configured so as to allow a die block to be attached to and moved with the reciprocated slide member.

23. Apparatus for trimming and, where and when desired, forming the leads of end-taped radial electronic components, after which the trimmed components are discharged to and into a bin, said apparatus including:

(a) a support frame and an enclosed D.C. motor attached to said support frame providing a drive means with forward, stationary and reverse actuation provisions and with selectable speeds;

(b) means for delivering end-taped components from a supply to a processing station of said apparatus, said delivery means carrying the end-taped components from a storage supply to and over a deflector carried at and by the upper portion of said support frame, thence to a free-turning sprocket having a multiplicity of tapered pins, and in association with this free-turning sprocket there is a free-turning grooved disc, the sprocket and disc adapted to align the tape and deliver said tape to the processing station, said free-turning sprocket and free-turning disc carried by a front plate secured to the support frame and with said processing station positioned at the mid-portion of and at a forward portion of said frame for said apparatus;

(c) means provided at said processing station and said apparatus for the trimming and severing the leads of end-taped components from said tape, said trimming and severing means including reciprocable dies moved by said enclosed drive means, said dies carried and retained by guides secured to said support frame, these dies adapted to cleanly sever the leads of the end-taped radial electronic components, said tape advanced in a precise relationship with said reciprocable dies with a precisely-rotated driven sprocket having a multiplicity of precisely-spaced, radially-disposed, tapered pins, these pins sized and spaced so as to enter formed apertures in the tape, this sprocket positioned between the reciprocable dies so that said tape and attached components are precisely advanced as the sprocket is rotated to position said tape and attached components in said processing station;

(d) a support block positioned at said processing station and slideable on posts carried by said support frame and moving said support block toward and away from said support frame while on said posts, this movement provided by the rotative movement of a shaft retained by said support frame, this shaft having a screw-threaded end that is retained and mounted in compatibly-formed threads in an aperture in the support block and intermediate the post-supporting means in said support block, the rotation of this shaft providing means for infinitely adjusting said support block to a desired position, said support block also having a retaining groove formed therein;

(e) means for removably securing each of a pair of opposed die assemblies arranged as left- and right-hand assemblies to said support block, each of said die assemblies also releasably secured to a reciprocable slide member carried in the retaining groove formed in the support block, the die assemblies selectively movable in and out in relation to a plane through the tapered pins on the driven sprocket, the rotation of this shaft providing means for in-and-out movement and for infinitely adjusting said support block to a desired position, said support block also having a retaining groove formed therein;

(f) a pair of driven eccentric barrel cams, each cam carried and rotated by a shaft in bearings mounted in said frame, each of said shafts moved in a precisely-timed relationship to each other and by the drive means, each eccentric cam reciprocably driving a box-like enclosure attached to a reciprocable slide adapted to removably carry a die assembly, one barrel cam having a regular eccentric actuation and the other barrel cam having an eccentric actuation with a dwell portion;

(g) guide means carried by the frame and apparatus and disposed between the delivery means and processing station and at said processing station and providing a guide bracket and finger fixedly carried by the support frame and in association with the driven sprocket disposed to engage and guide the end-taped components and tape so as to bring the tape and components into positive positioning and placement on the tapered pins of the driven sprocket as said sprocket is rotated, and (h) movable guide means resiliently actuated and including a spring-biased finger moved with and by the die block assembly moved by the barrel cam having the dwell portion, this movable guide means adapted to engage and straighten a body of a component when misaligned.

24. A method for trimming and, where and when desired, forming the leads of end-taped radial electronic components, after which the processed components are discharged into an accumulation device, said method including the steps of:

(a) providing a support frame and enclosed drive means, said drive means having forward, stationary and reverse actuation provisions at and with selectable speeds;

(b) supporting, retaining and delivering end-taped components from a supply to a processing station which is positioned at a mid-portion of and at a forward portion of said frame and is carried by said support frame;

(c) trimming and severing the leads of end-taped components from said end-tape at said processing station, the trimmed leads having the desired precise length, and providing at this processing station reciprocable and cooperating dies that cleanly sever and trim the leads in conjunction with rotating a driven sprocket characterized as having a multiplicity of radially disposed tapered pins, said pins sized and positioned to precisely enter formed apertures in the tape and position said tape and components in said processing station, said dies carried and retained by guides secured to said support frame and with this driven sprocket positioned between the reciprocably advanced dies so that said tape and attached components are precisely positioned as the sprocket is rotated;

(d) carrying a support block on said support frame and positioning said support block at said processing station on posts carried by said support frame so that this support block may be infinitely moved in and out of the plane of the tapered pins of the driven sprocket at the processing station;

(e) reciprocating opposed die assemblies, each removably carried in die blocks, and securing each die block to a reciprocated slide member carried in and slideable in a groove formed in said support block;

(f) rotatably driving a pair of eccentric barrel cams, each of which is carried on a shaft in bearings mounted in said frame, each of said shafts moved in a precise and time relationship to each other and by the drive means, each eccentric cam reciprocably driving a box-like enclosure connected to and moving the reciprocable slide member;

(g) releasably securing left- and right-hand die assemblies to slide members carried in said groove means formed in and provided in said support block;

(h) fixedly positioning guide means on said frame and apparatus and securing said guide means between the delivery means and processing station so as to engage and guide body portions of the end-taped components before processing and insuring that each component is brought into positive positioning on the tapered pins of the driven sprocket during processing, and (i) providing movable guide means so as to be resiliently actuated by and with one of the die assemblies, said movable guide means adapted to engage the component body during die operations and reciprocated by and with a die block, said movable guide means carried by a reciprocated die block.

25. The method of processing end-taped components, as in claim 24, and including the further step of providing a free-turning sprocket and an associated grooved disc or pulley, this sprocket and disc mounted and carried on a front face portion of the apparatus housing and intermediate a deflector support disposed at the upper portion of the apparatus and the driven sprocket, said free-turning sprocket and grooved disc providing alignment and control of a rapidly-advanced tape.

26. The method of processing end-taped components, as in claim 24, and including the further step of moving the support block in and out from the support frame on posts carried and secured to said frame, this in-and-out movement provided by rotating a shaft carried by said frame and having screw threads on one end and with these screw threads engaging compatibly-formed threads in sid support block, this shaft rotated by an associated crank remotely positioned from said thread-ended shaft.

27. The method of processing end-taped components, as in claim 26, including securing a timing belt pulley to the shaft having a screw-end and driving this pulley by a timing belt and moving this belt by another rotatable timing belt pulley by a crank shaft remote from the shaft having the threaded end, this crank shaft manipulable while the apparatus is in operation.

28. The method of processing end-taped components, as in claim 24, including the further step of making the box-like enclosure of four members and attaching this box-like enclosure to a reciprocated slide member, the barrel cam moving this enclosure while operatively engaging two opposed vertical members so spaced as to slideably engage the periphery of a barrel cam.

29. The method of processing end-taped components, as in claim 28, including the further step of lubricating each of the barrel cams by a felt or felt-like wiper treated with a lubricant and moving by bias means this wiper into contact with the periphery of the barrel cam and therewith applying a thin film of lubricant to the periphery of the barrel cam and the contacting box-like follower members.

30. The method of processing end-taped components, as in claim 29, including the further step of forming one barrel cam with a constant eccentric actuation and the other barrel cam as having a dwell portion in the actuation, the die assembly having the cut-off knife moved by the barrel cam with a constant eccentric actuation and with an associated die member carried in the other die block and this other die block moved by the barrel cam having the dwell portion.

31. The method of processing end-taped components, as in claim 24, including the further step of rotatably driving the shafts carrying the barrel cams with at least one timing belt and a secured timing belt pulley on each shaft providing a positively-timed and controlled movement of each shaft, said shafts driven by a D.C. motor and at least one timing belt and associated timing belt pulleys.

32. The method of processing end-taped components, as in claim 24, including providing a hinged guard so as to be swung into a protective position whereby the reciprocated die portions may be reciprocated with no danger to the operator, and hinging this guard at its upper edge so as to be swung into a non-interfering position, permitting repair, replacement, sharpening and/or exchange of die assemblies and for feeding the tape to the processing station.

33. The method of processing end-tape components, as in claim 32, including the further step of providing an interlock switch carried by the support frame and a switch actuator carried by the hinged guard.

34. The method of processing end-taped components, as in claim 33, including the further step of powering this actuation by a D.C. motor having a selective speed and direction, and providing in the control circuit for the operation of this D.C., an override capability of the interlock switch so as to permit threading of the tape while the hinged guard is in a lifted condition.

35. The method of processing end-taped components, as in claim 24, including providing a finger and urging said finger into position by a spring bias, said finger carried by and movable with a die assembly and block moved with the reciprocated slide member, said finger disposed to align the component body in an attitude and position when said body is in other than desired and anticipated position.

* * * * *